(12) United States Patent
Chen

(10) Patent No.: US 6,426,256 B1
(45) Date of Patent: Jul. 30, 2002

(54) METHOD FOR FABRICATING AN EMBEDDED DRAM WITH SELF-ALIGNED BORDERLESS CONTACTS

(75) Inventor: Tung-Po Chen, Tai-Chung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/375,518

(22) Filed: Aug. 17, 1999

(51) Int. Cl.$^7$ .......................................... H01L 21/8242
(52) U.S. Cl. ..................... 438/256; 438/240; 438/241; 438/253; 438/634; 438/396; 438/624; 257/760
(58) Field of Search ................................. 438/256, 240, 438/241, 210, 253, 396; 257/760

(56) References Cited

U.S. PATENT DOCUMENTS

| | | | | |
|---|---|---|---|---|
| 4,966,870 A | * | 10/1990 | Barber et al. | |
| 5,668,035 A | * | 9/1997 | Fang et al. | 438/239 |
| 5,858,831 A | * | 1/1999 | Sung | 438/241 |
| 5,960,318 A | * | 9/1999 | Peshke et al. | 438/637 |
| 5,998,251 A | * | 12/1999 | Wu et al. | 438/241 |
| 6,017,790 A | * | 1/2000 | Liou et al. | 438/240 |
| 6,025,255 A | * | 2/2000 | Chen et al. | 438/595 |
| 6,072,237 A | * | 6/2000 | Jang et al. | 257/698 |

\* cited by examiner

*Primary Examiner*—Matthew Smith
*Assistant Examiner*—Belur Keshavan

(57) ABSTRACT

A method for manufacturing an embedded DRAM with self-aligned borderless contacts is provided. The method comprises providing a substrate having a first device region and a second device region. The first device region comprises a first transistor and the second device region has a second transistor. A silicide block layer is formed over the second device region. An etching stop layer covers all device regions. A mask layer covers the first device region. Then the etching stop layer not covered by the mask layer is removed. A first dielectric material layer is formed on all the device regions and therein a first contact window is on the second device region. A second dielectric material layer is next formed and therein a second contact window is on the second device region. A third dielectric material layer is formed and therein at least a third contact window is coupled to the first transistor of the first device region. A borderless contact is consisted of the contact window coupled to the substrate and a metallic node on the contact window.

12 Claims, 3 Drawing Sheets

METHOD FOR FABRICATING AN EMBEDDED DRAM WITH SELF-ALIGNED BORDERLESS CONTACTS

BACKGROUND OF THE INVENTION

1. Field of the Invention

The present invention relates to a method for manufacturing an embedded dynamic random access memory (DRAM) self-aligned with borderless contacts (SAC) and more particularly to a method in combining a logic region with borderless contact windows and a dynamic random access memory (DRAM).

2. Description of the Prior Art

In recent years, due to the use of electronic components in a great quantity the need of semiconductor devices is increasing rapidly, and in particular due to the widespread of computerization, this need is even more accelerated. Hundreds and thousands of transistors are needed in creating a highly complex integrated circuit. In order to improve the manufacturing of electronic devices within an integrated circuit of a single semiconductor chip, a highly integrated but diminished layout is required to improve the quality of semiconductor devices.

Knowing that the requirement for integration is greater, combining a logic region with a DRAM is widespread when applied on chips. Bit-line contact windows and node contact windows in DRAM have normally been designed as self-aligned contacts (SACs) so to reduce the occupied chip area.

Dynamic Random Access Memory (DRAM) is one of the main volatile memories, and the so-called "single transistor DRAM cell" is made up of a metal oxide semiconductor (MOS) transistor and a capacitor.

In accompanying with the requirement of high integration, the size of MOS and the line width of metallic lines have become smaller and smaller. When making a contact between a metallic line and a source or drain region of a MOS, contact between part of the metallic line and shallow trench isolation (STI) might occur. This is a problem because the size of the source/drain region is smaller than the metallic line or because miss-alignment between the metallic line and the source/drain region. Once the miss-alignment occurs, an insulation of the shallow trench isolation should not be affected. In ensuring that and without any reduction in device integration, a manufacturing method for borderless contact is generated.

Nevertheless, during the combining process between a logic region with borderless contacts and a DRAM, a silicon nitride layer that is used as an etching stop layer at the logic region is deposited after the formation of salicide of the drain/source region. Therefore, difficulties might occur during an etching process of DRAM self-aligned contacts.

SUMMARY OF THE INVENTION

In accordance with the present invention, problems induced during the combining process between a logic region and a memory region exists. The main objective of the present invention is to overcome all the drawbacks caused during the self-aligned contact etching process by removing an etching stop silicon nitride layer for borderless contacts within the memory region. Eventually, moving toward a successful combination between the logic region and the memory region.

Another objective of the present invention is to provide a fabricating method, that by is capable of reducing a short circuit phenomena generated during an etching process in between a bit-line and a polysilicon gate within the memory region.

A method for manufacturing an embedded DRAM with self-aligned borderless contacts is provided. The method comprises providing a substrate having a first device region and a second device region. The first device region comprises a first transistor and the second device region has a second transistor. A silicide block layer is formed over the second device region. An etching stop layer covers all device regions. A mask layer covers the first device region. Then the etching stop layer not covered by the mask layer is removed. A first dielectric material layer is formed on all the device regions and therein a first contact window is on the second device region. A second dielectric material layer is formed next and therein a second contact window is on the second device region. A third dielectric material layer is formed and therein at least a third contact window is coupled to the first transistor of the first device region. A metallic node is formed on the third contact window.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 1A–1G, the process flow of one preferred embodiment according to the present invention is depicted in cross-sectional views. These drawings merely show several key steps in sequential processes.

Figure 1A:
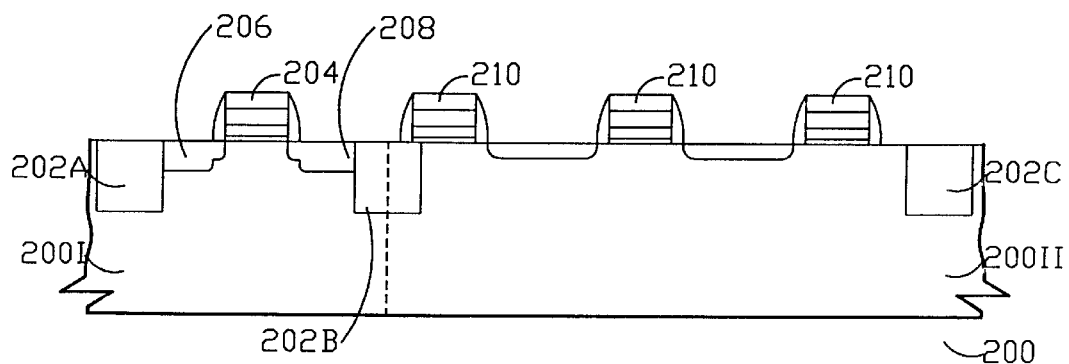
FIG. 1A to FIG. 1G depicts the process flow of a preferred embodiment according to the present invention in cross-sectional views

Shown in FIG. 1A, a substrate 200 comprises a logic region 200I and a DRAM region 200II. In the logic region 200I, there are a gate structure 204 on the substrate 200, a source region 206 and a drain region 208 in the substrate 200. The gate structure 204 consists of a silicon nitride layer as the topmost layer, a silicide layer, a polysilicon layer, and a gate oxide layer as the bottommost layer. Furthermore, a multitude of isolation devices, such as shallow trench isolations 202A and 202B, are formed at the outermost sides of the source region 206 and the drain region 208. In the DRAM region 200II, there are a multitude of transistor structures 210 on the substrate 200 and isolation devices, such as shallow trench isolations 202C and co-used one 202B at the sides of the transistor structures 210.

Figure 1B:
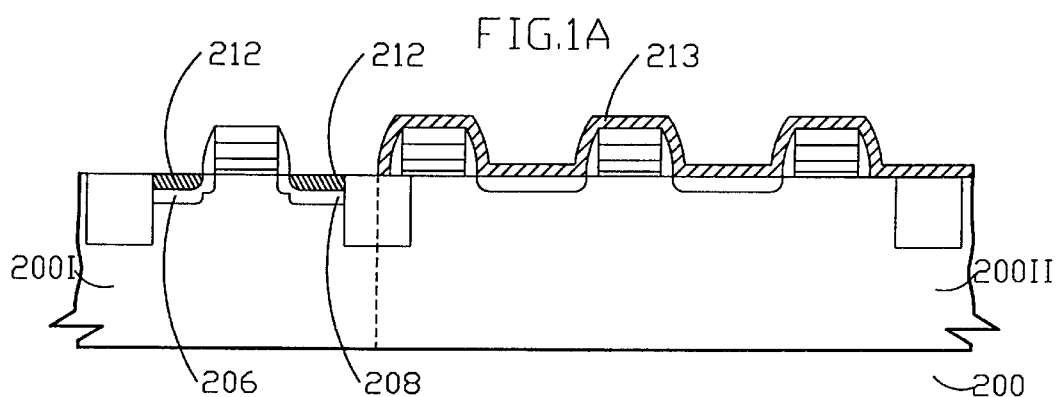

Next depicted in FIG. 1B, a salicide block layer 213 is formed to cover the surface of the DRAM region 200II. A silicide layer 212, such as a TiSi$_2$ layer, is formed on the surface of the source region 206 and the drain region 208 of the logic region 200I. The silicide layer 212 can reduce the sheet resistance of the source region 206 and the drain region 208. To be specific, there is no silicide layer 212 formed in the DRAM region 200II because the salicide block layer 213 covers the DRAM region 200II.

Figure 1C:
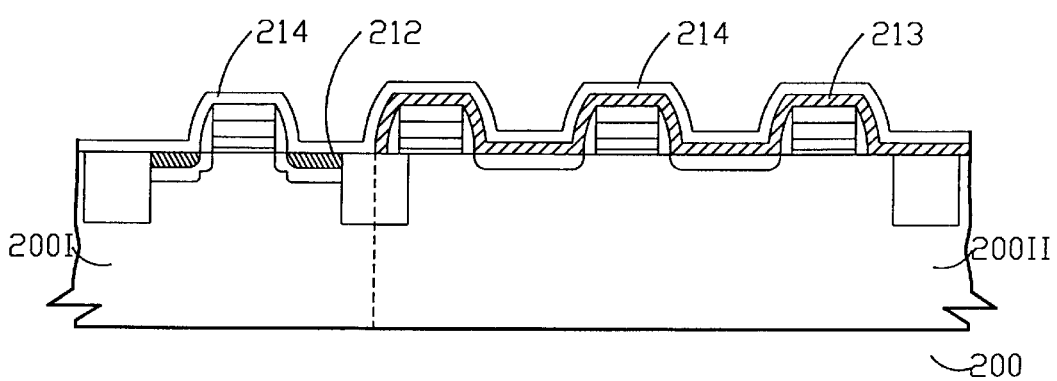

Shown in FIG. 1C, a silicon nitride layer 214 is formed to cover the surfaces of both the logic region 200I and the DRAM region 200II. In the embodiment, the silicon nitride layer 214 is formed by a chemical vapor deposition method and has a thickness about the range of 300 and 500 angstroms. The silicon nitride layer 214 is used as an etching stop layer during the formation of borderless contact windows.

Figure 1D:
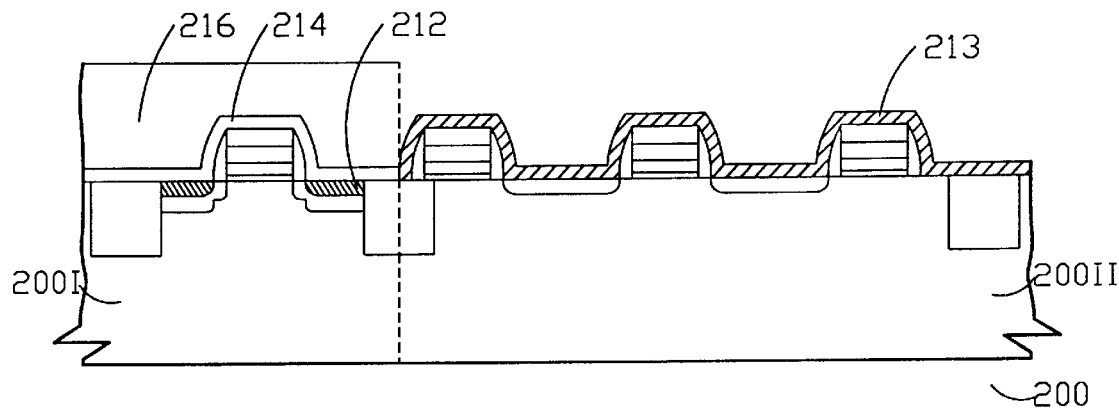
Figure 1E:
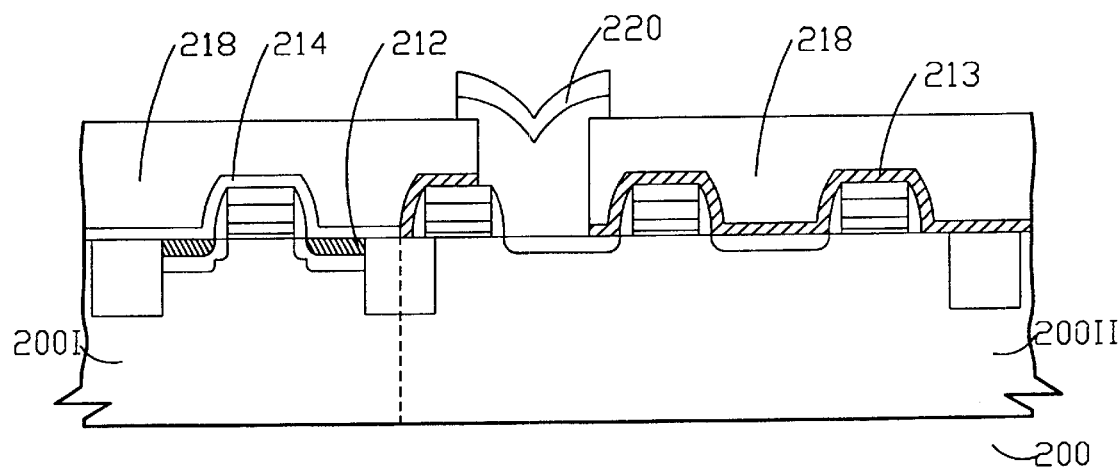
Figure 1F:
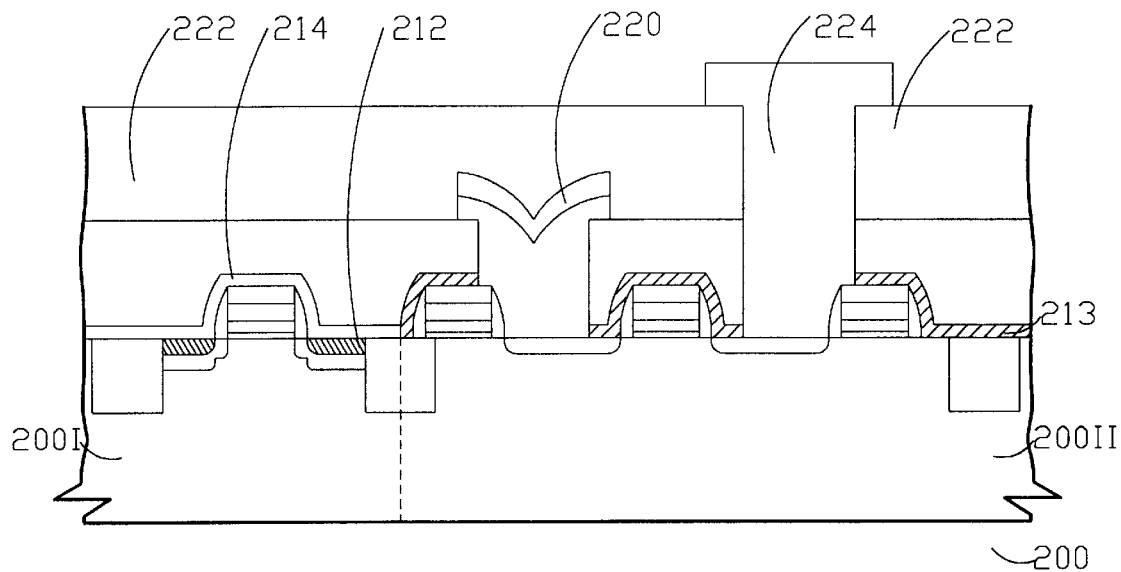
Figure 1G:
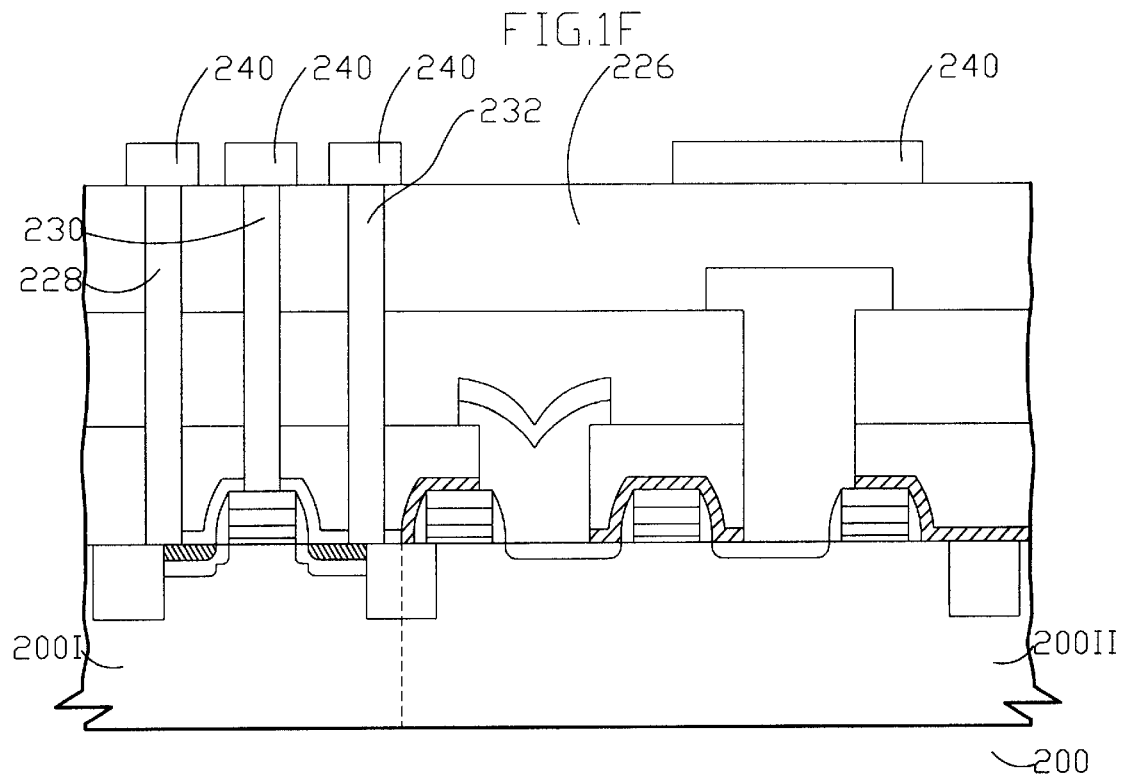

Shown in FIG. 1D, a photoresist film 216 first covers the logic region 200I to expose the DRAM region 200II. The photoresist film 216 is formed by the method of conventional spin coating. Then the silicon nitride layer 214 on the surface of the DRAM region 200II is removed to expose the salicide block layer 213 of the DRAM region 200II.

Next, the photoresist film 216 is removed by any suitable method. To be specific, there is still the silicon nitride layer 214 on the surface of the logic region 200I. An inter-poly dielectric layer 218 is formed on the surfaces of both the logic region 200I and the DRAM region 200II. A pattern (not shown) is transferred into the inter-poly dielectric layer 218 to form a contact hole in the inter-poly dielectric layer 218 on the DRAM_region 200II. Then a self-aligned bit-line contact window 220 is formed on the DRAM region 200II by any suitably conventional methods, shown in FIG. 1E.

Next, another inter-poly dielectric layer 222 is first formed on the surfaces of both the login region 200I and the DRAM region 200II. Similarly, another contact hole is defined in the DRAM region 200II and then a self-aligned node contact window 224 is formed in the DRAM region 200II, shown in FIG. 1F. Furthermore, the self-aligned node contact window 224 is at the side of the self-aligned bit-line contact window 220 and separated by one of the transistor structures 210.

Next an inter-level dielectric (ILD) layer 226 is first deposited on the surfaces of both the login region 200I and the DRAM region 200II. Then the inter-level dielectric layer 226 is planarized by chemical mechanic polishing. Multitudes of contact holes are defined in the logic region 200I and then multitudes of borderless contact windows 228, 232 and a contact window 230 are formed in the logic region 200I. The contact window 230 is directly contacted with the gate structure 204. The borderless contact windows 228 and 232 are contacted with the substrate 200. Next, a metallic layer (not shown) is first formed on the surfaces of both the logic region 200I and the DRAM region 200II and is then etched to form multitudes of metallic nodes 240 thereon, shown in FIG. 1G. The metallic nodes 240 in the logic region 200I are coupled to the borderless contact windows 228, 232 and the contact window 230.

In the present invention, before the formation of the contact hole for the self-aligned bit-line contact window 220, the silicon nitride layer 214 in the DRAM region 200II is first removed. It is advantageous for the formation of the self-aligned bit-line contact window 220 to avoid etching a multi-layer structure that may consist of the inter-poly dielectric layer 218, the silicon nitride layer 214, and the salicide block layer 213. Furthermore, the short circuit of the transistor structure 210 in the DRAM region 200II is reduced during the etching process for formation of the self-aligned bit-line contact window 220.

What is claimed is:

1. A method for manufacturing an embedded dynamic random access memory (DRAM) self-aligned borderless contacts (SAC), said method comprising:

providing a substrate having a first device region and a second device region, said first device region comprising a first metal oxide semiconductor (MOS) transistor and a plurality of first isolation structures formed on said first device region, said second device region comprising a second metal oxide semiconductor (MOS) transistor and a plurality of second isolation structures formed on said second device region;

forming a silicide block layer over said second device region;

forming an etching stop layer covering said first device region and said silicide block layer of said second device region;

forming a mask layer on said first device region to expose said etching stop layer of said second device region;

removing said etching stop layer not covered by said mask layer;

forming a first dielectric material layer on said first device region and said second device region, said first dielectric material layer defining and patterning out a first contact window on said silicide block layer of said second device region;

forming a second dielectric material layer on said first device region and said second device region, said second dielectric layer defining and patterning out a second contact window on said first dielectric material layer of said second device region;

forming a third dielectric material layer on said first device_region and said second region;

forming at least a third contact window coupled to said first transistor of said first device region; and forming a metallic node on said third contact window.

2. The method in accordance with claim 1, wherein said first and second dielectric material layers comprise a plurality of silicon oxide layers.

3. The method in accordance with claim 1, wherein said etching stop layer comprises a silicon nitride layer.

4. The method in accordance with claim 1, wherein said step of forming said etching stop layer comprises using chemical vapor deposition.

5. The method in accordance with claim 1, wherein said etching stop layer has a thickness in between about 300 and 500 angstroms.

6. The method in accordance with claim 1, wherein said mask layer comprises a photoresist layer.

7. The method in accordance with claim 1, wherein said step of forming said first and second dielectric material layers comprises using chemical vapor deposition.

8. The method in accordance with claim 1, wherein said first contact window is a self-aligned bit-line contact window.

9. The method in accordance with claim 1, wherein said second contact window is a self-aligned node contact window.

10. The method in accordance with claim 1, wherein a third contact window is a borderless contact window.

11. The method in accordance with claim 10, wherein said borderless contact window is used for formation of multi-level interconnects.

12. A method for manufacturing an embedded dynamic random access memory (DRAM) self-aligned borderless contacts, said method comprises:

providing a substrate having a logic region and a memory region, said logic region comprising a first metal oxide semiconductor (MOS) transistor and a plurality of first shallow trench isolations (STI), said memory region comprising a second metal oxide semiconductor (MOS) transistor and a plurality of second shallow trench isolations;

forming a silicide block layer on said memory region;

forming a silicon nitride layer covering said logic region and said memory region;

forming a photoresist layer on said logic region;

removing said silicon nitride layer not covered by said photoresist layer;

forming a first inter-poly dielectric layer (IPD1) on said substrate, said first inter-poly dielectric layer defining and patterning out a self-aligned bit-line contact window on said silicide block layer of said memory region;

forming a second inter-poly dielectric layer on said substrate, said second inter-poly dielectric layer defining and patterning out a self-aligned node contact window on said first inter-poly dielectric layer of said memory region;

forming an inter-level dielectric (ILD) material layer on said substrate;

forming a first contact window, a second contact window and a third contact window within said logic region, said second contact window contacted to said first metal oxide semiconductor transistor, said first contact window and said third contact window contacted with said first shallow trench isolations individually and formed a plurality of borderless contact windows; and forming a plurality of metallic nodes on said first, second, and third contact windows.

* * * * *